United States Patent [19]

Arai et al.

[11] Patent Number: 5,168,021
[45] Date of Patent: Dec. 1, 1992

[54] METHOD FOR EXPOSING PREDETERMINED AREA OF PERIPHERAL PART OF WAFER

[75] Inventors: Tetsuji Arai, Yokohama; Shinji Suzuki; Nobutaka Kajiura, both of Kawasaki; Shinetsu Miura, Yokohama; Kazumoto Tochihara, Kawasaki, all of Japan

[73] Assignee: Ushio Denki, Tokyo, Japan

[21] Appl. No.: 570,762

[22] Filed: Aug. 22, 1990

[30] Foreign Application Priority Data

Sep. 21, 1989 [JP] Japan .................. 1-243492
Sep. 21, 1989 [JP] Japan .................. 1-243493

[51] Int. Cl.$^5$ ............................................ G03F 9/00
[52] U.S. Cl. ........................................ 430/22; 430/30;
355/53; 250/442.1; 250/491.1; 250/492.1
[58] Field of Search .................. 430/22, 30; 355/53;
250/442.1, 491.1, 492.1

[56] References Cited

U.S. PATENT DOCUMENTS

| | | | |
|---|---|---|---|
| 3,876,301 | 4/1975 | Kosugi et al. | 355/53 |
| 4,003,061 | 1/1977 | LaCanfora | 355/1 |
| 4,711,567 | 12/1987 | Tanimoto | 355/53 |
| 4,794,305 | 12/1988 | Matsukawa | 250/442.1 |
| 4,891,526 | 1/1990 | Reeds | 250/442.1 |
| 4,904,570 | 2/1990 | Gotou | 430/22 |

FOREIGN PATENT DOCUMENTS

| | | | |
|---|---|---|---|
| 0123153 | 10/1984 | European Pat. Off. | 430/22 |
| 58-092221 | 6/1983 | Japan | 430/22 |
| 58-139144 | 8/1983 | Japan | 430/22 |
| 59-138335 | 8/1984 | Japan | 430/22 |
| 60-060724 | 4/1985 | Japan | 430/22 |

Primary Examiner—Charles L. Bowers, Jr.
Assistant Examiner—Thomas R. Neville
Attorney, Agent, or Firm—Armstrong & Kubovcik

[57] ABSTRACT

A method for exposing a peripheral part of a wafer according to the present invention is to expose the peripheral part, taking account of a correcting angle determined by calculating the amount of misalignment between a center of a wafer and a rotational center for the wafer from the amount of displacement of a sensor for detecting a peripheral edge. Therefore, any wafer-centering motion and mechanism are not required, and this method is higher in precision of exposing position.

2 Claims, 6 Drawing Sheets

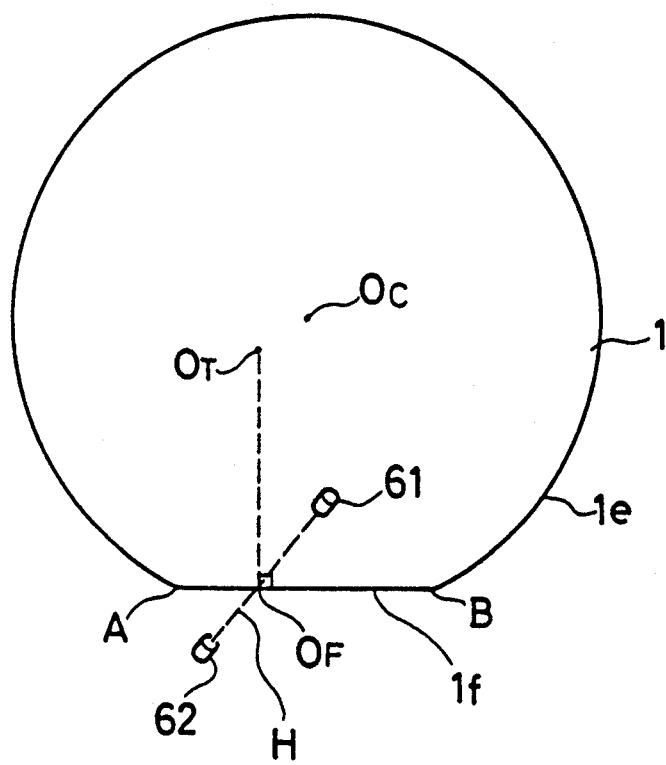
FIG.3
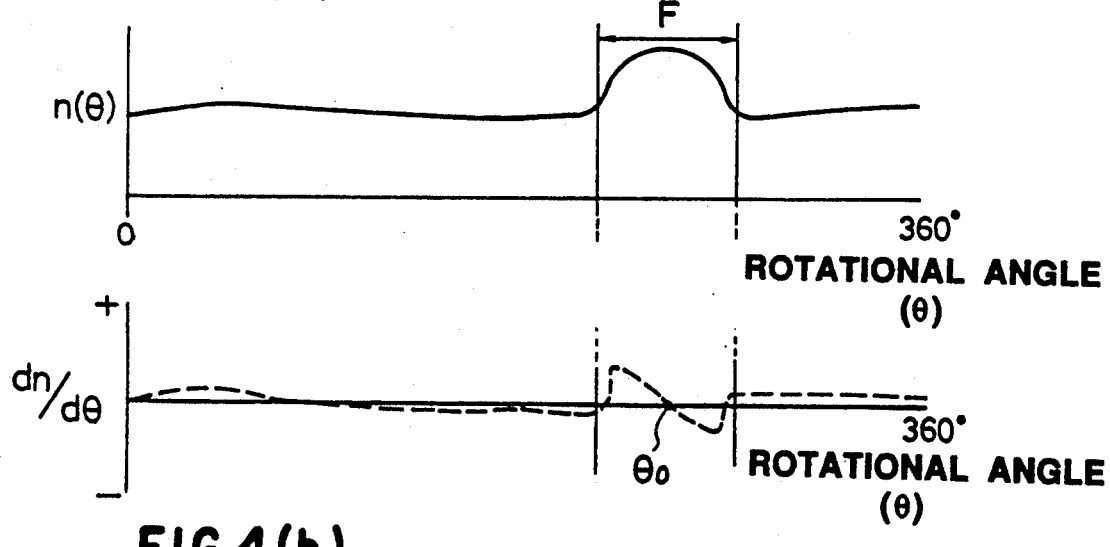
FIG.4(a)
FIG.4(b)

METHOD FOR EXPOSING PREDETERMINED AREA OF PERIPHERAL PART OF WAFER

BACKGROUND OF THE INVENTION

1. Field of the Invention

The present invention relates to a method for selectively exposing a predetermined area of a peripheral part of a semiconductor wafer used for producing ICs, LSIs and other electronics elements.

2. Description of the Prior Art

In forming a fine pattern in a process for producing ICs, LSIs and the like, it is a conventional practice to apply a photoresist onto a silicon wafer or the like, expose and develop it, thereby forming a resist pattern Then, the resulting photoresist pattern is used as a mask to effect ion implantation, etching, lifting-off and other steps.

Usually, the resist is applied by a spin coating process. The spin coating process involves spinning the wafer while applying a resist onto a central location on a wafer surface so as to distribute the resist over the entire surface by a centrifugal force.

A peripheral part of a wafer is mechanically chucked or held in handling in many processes. And on a peripheral part of a wafer, a pattern tends to be distortedly transfered. So, a peripheral part is not usually utilized in producing elements. But, resist is applyed on the peripheral part the same as the pattern formation part. If the resist is positive type, the resist on a peripheral part may remain after development. In some cases, the peripheral part of the wafer with resist may be chucked or held mechanically and may be rubbed by a wall of a container such as a wafer cassette, resulting in a source of generation of refuse. Particularly under the increase of functional level and integration density, it is a serious problem that an unnecessary resist portion remaining on the peripheral part of the wafer generates refuse to provide a reduced yield.

Thereupon, for removing such an unnecessary resist portion remaining on the peripheral part of the wafer even after development, an approach conventionally practiced is to specially expose the unnecessary resist portion on the peripheral part of the wafer to remove it in a developing step, apart from the exposure for forming the pattern.

FIGS. 10a, 10b, 10c and 10d are schematic diagrams for explaining a prior art method for exposing a peripheral part of a wafer to remove such an unnecessary resist portion.

The wafer 1 is placed onto a rotary stage 2 by means of a transporting system (not shown), and the rotary stage 2 is rotated. An orientation flat 1f of the wafer 1 is detected by a sensor 72, and when the orientation flat 1f has substantially reached a predetermined position, the rotation is stopped. Then, centering and positioning of the orientation flat 1f are conducted by use of an orientation flat pushing plates 74a and pins 74b, and 74c and 74d.

After such positioning, light is illuminated through an emitting end of a fiber lightguide while rotating the wafer 1 to expose circle wise the peripheral part. By the exposure upon this rotating motion (in a direction indicated by an arrow 76a), a peripheral part along the orientation flat 1f is not completely exposed because such exposure is as shown in FIG. 10c. Therefore, it is necessary to further effect an exposure by moving the emitting end 75 in parallel to the orientation flat 1f (in a direction of an arrow 76b), after moving the orientation flat 1f to a predetermined location and stop it thereat.

The above prior art method for exposing the peripheral part of the wafer is to conduct a circumferential exposure of a peripheral region with a fixed width from an edge of the wafer.

However, there is a demand that a wafer can be utilized to the utmost extent bringing about no reduction in yield, in view of an efficiency of utilization of the wafer, or utilize to the entire extent other than several wafer portions at which the wafer is held by holding claws.

Accordingly, a technique for selectively exposing only portions contacting with the wafer-holding claws is required However, it is technically very difficult to selectively expose a predetermined are on the peripheral part which is assigned as a region contacting with the wafer holding claws.

SUMMARY OF THE INVENTION

The present invention has been accomplished with such circumstances in view, and it is a first object of the present invention to provide a method for exposing a peripheral part of the wafer, wherein a predetermined are of the peripheral part of the wafer can be selectively exposed.

It is a second object of the present invention to provide a method for exposing a predetermined are of a peripheral part of the water with a high accuracy of exposing-position without a need for any wafer-centering motion and mechanism.

To achieve the above objects, according to the present invention, there is provided a method for exposing predetermined area of peripheral part of wafer on which photoresist coated, comprising the steps of;

while said wafer is rotated, detecting an angle of rotation, shifting the light emittting end of an optical fiber lightguide close to the rotational axis when an angle of rotating is an exposure angle according to a predetermined angle which is standardizing a singular point of said wafer, exposing predetermining said area of peripheral part of wafer, and shifting said end away from the turning axis after predetermined angle of rotating with said exposing.

With the above method, a predetermined are of the peripheral part of the wafer can be selectively exposed. Even if a center of the wafer and a rotational center for the wafer are misaligned from each other, the exposure of the predetermined area of the peripheral part of the wafer can be achieved without a need for any special centering motion and mechanism.

BRIEF DESCRIPTION OF THE DRAWINGS

FIG. 3 is a diagram for illustrating a singular point in the embodiment of the present invention;

FIG. 4a and 4b are graphs illustrating a relationship between the position of the photosensor stored in a position-detecting means and the rotational angle, FIG. 4a illustrating a measured value, and FIG. 4b illustrating a differentiated value;

DESCRIPTION OF THE PREFERRED EMBODIMENT

The present invention will now be described by way of one embodiment with reference to the accompanying drawings.

Figure 1:
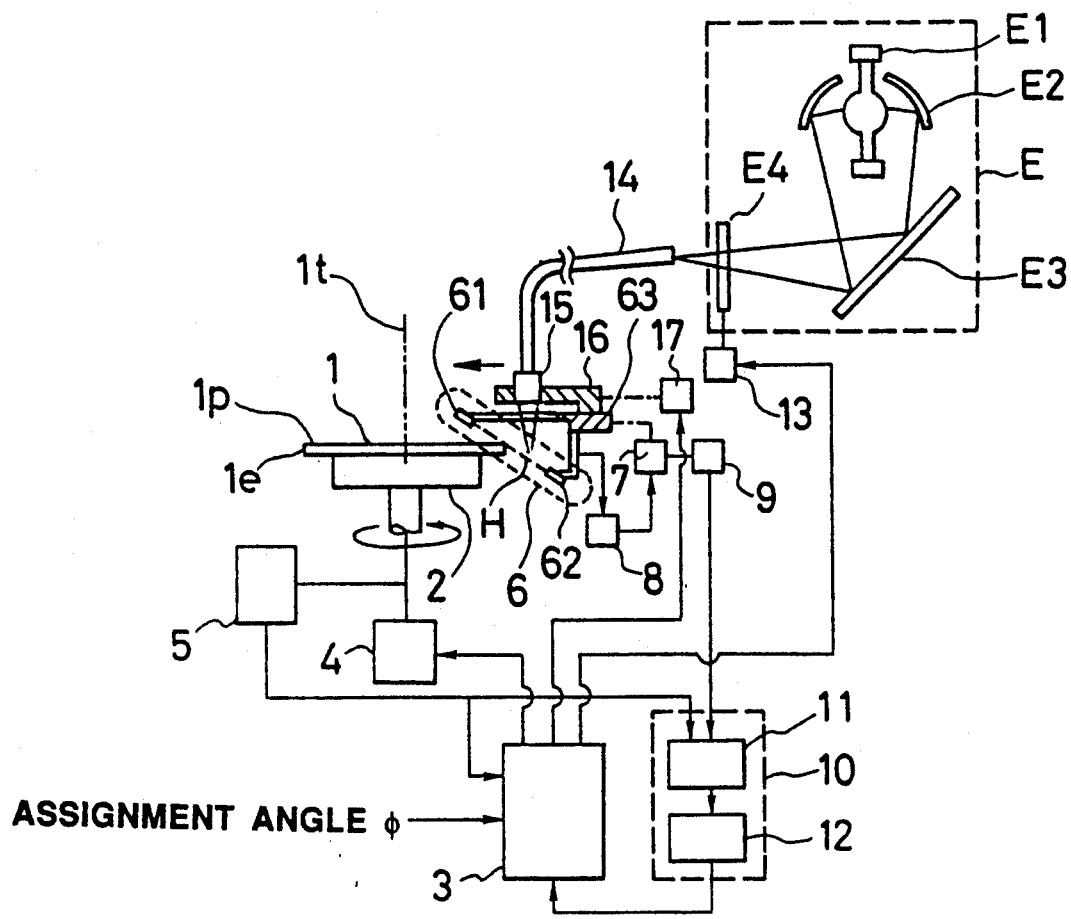
FIG. 1 is a schematic diagram of an apparatus for carrying out a method for exposing a peripheral part of a wafer according to an embodiment of the present invention.

A method for exposing a peripheral part of a wafer to light according to one embodiment of the present invention comprises;

a step I of rotating the wafer for one rotation, i.e., through 360 degree and controlling a position of a sensor thereby it may sense the edge of wafer at all times following the shift of the edge caused by the rotation.

a step II of calculating a singular point on the edge of the wafer from informations for the position of the sensor which has been under the position control;

a step III of calculating eccentricity of rotational axis to the center of wafer, wafer and calculating a correcting angle $\alpha$ from the calculated eccentricity, thereby determining an exposure angle $\theta_E$ from the correcting angle $\alpha$ and a previously inputted assignment angle $\phi$; and a step IV of rotating the wafer again and allowing a fiber lightguide to rectilinearly move in accordance with the determined exposure angle $\theta_E$ to provide a selective exposure of a predetermined area of the peripheral part of the wafer. FIG. 1 is a schematic diagram of an apparatus for carrying out the method for exposing a peripheral part of a wafer according to the embodiment of the present invention. In FIG. 1, reference numeral 1 indicates a wafer, and reference character 1e designates a edge of the wafer. Further, reference numeral 2 is a rotary stage; 3 is a main controller; 4 is a stage-driving mechanism; 5 is a rotational angle read mechanism; 6 is a transmission type photosensor serving as a edge detecting sensor; 7 is a position control mechanism; 8 is a circuit for driving the position control mechanism; 9 is means for detecting the position of the edge detecting sensor; 10 is an auxiliary controller; 11 is a memory; 12 is a calculator means; 13 is a shutter driving mechanism; and 14 is a fiber lightguide; and 15 is an emitting portion. Reference character E indicates an exposure light source.

The step I will be first described below.

Figure 2:
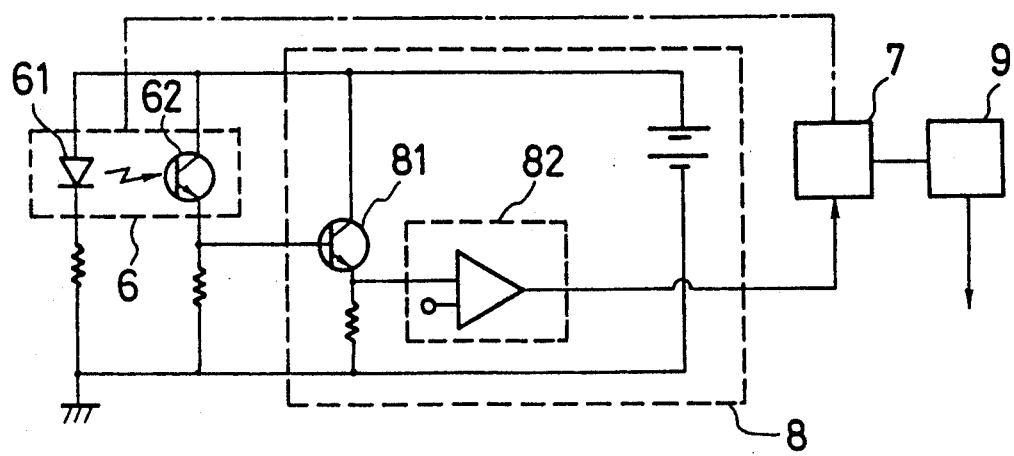
FIG. 2 is a diagram for explaining a position control for a photosensor in the apparatus shown in FIG. 1.

FIG. 2 is a diagram for explaining the position control for the photosensor 6 in the apparatus shown in FIG. 1.

Referring to FIG. 1, the photosensor 6 is controlled to detect the edge 1e of the wafer which is constantly rotated. More specifically, as shown in FIG. 2, a photoelectric current from a light receiver 62 which has received light from a light emitter 61 is amplified in an amplifier 81 and then compared in a comparator 82. The reference voltage for the comparator 82 may be reset as a value of a photoelectric current which the light receiver generates when the photosensor 6 is disposed so that an optical axis H shown in FIG. 3 may be in contact with the edge 1e. The output signal from the comparator 82 is delivered to the position control mechanism 7 which allows a sensor head 63 holding the light emitter 61 and the light receiver 62 thereon to rectilinearly move toward the rotational axis 1t in response to the signal received from the comparator 82 so as to constantly detect the peripheral edge of the wafer. The position control mechanism 7 used may be a servo motor.

The position of the photosensor 6 which is under a position control by the position control mechanism 7 is detected by a position detector means 9 which may be, for example, in the form of a pulse counter for counting the pulse number from the servo motor used as the position control mechanism 7. A position of the photosensor 6 can be a number of pulses which are counted by pulse counter on the basis of a predetermined stand by position, because a distance of moving in one pulse is known.

The informations for the position of the photosensor 6 detected by the position detector means 9 and the rotational angle for the wafer 1 read by the rotational angle read mechanism 5 are sequentially delivered to and memorized in the memory means 11. In this manner, the wafer 1 is rotated for one rotation, i.e., through 360 degree, and data that the photosensor 6 has been in what position at each rotational angle is memorized in the memory means 11. The memory means 11 used may be in the form of an IC memory.

The step II will be described below.

In FIG. 3, reference numeral 1 indicates a wafer, and reference character $O_T$ indicates a point where the rotational axis 1t crosses the surface of wafer 1 (which will be referred to as a rotational center hereinafter), reference character 1f being an orientation flat, reference character $O_F$ being an original point on the orientation flat as one example of the singular point.

The singular point is a datum point required for assigning an assignment angle, the determination of an exposure angle, or the like. The wafer 1 is conventionally provided with an orientation flat 1f which indicates a directionality of the crystalline structure. In this embodiment, the orientation flat 1f may be detected to establish a datum point. However, the orientation flat 1f has a length AB and hence, an intersection $O_F$ of a perpendicular drawn from a rotational center $O_T$ to the orientation flat 1f is selected for use as a singular point. Recently, a wafer having a small notch provided at its edge and utilized for the alignment has been used, and with such a wafer, the notch may be used as a singular point. In short, it is only required that any point serving as a datum point can be found.

FIG. 4a and 4b are graphs illustrating a relationship of the position of the photosensor 6 and the rotational angle, FIG. 4a illustrating a measured value and FIG. 4b illustrating a differentiated value.

The informations for the position of the photosensor 6 delivered from the position detecting means 9 are pulse number from the servo motor used as the position control mechanism 7. The pulse number n is a measured value of the information for the position of the photosensor 6 and represented by the axis of ordinates in FIG. 4a. A value $dn/d\theta$ of the pulse number n differentiated by the rotational angle $\theta$ corresponds to an amount of shift of photosensor 6 and is represented by the axis of ordinates in FIG. 4b. The axis of abscissas represents the rotational angle $\theta$. It is also possible to calculate the rotational angle $\theta$ by the calculating means 12 according to the expression: $\theta$=wt, $\theta$=wdt, using of data of an angular velocity (w) of rotation of the rotary stage 2 which has been previously inputted in the memory means 11.

When the wafer 1 is started to be rotated and the photosensor 6 is moved to follow up the shift of the edge 1e, the value of dn/d$\theta$ varies as shown by a dotted line in FIG. 4b. Here, it is believed that a region F where dn/d$\theta$ largely varies to positive (+) and negative (−) sides is a range of angles at which the photosensor 6 detects a portion of the orientation flat 1f. Further, $\theta_o$ where dn/d$\theta$=0 in the region F indicates a state of the photosensor 6 displaced to a point nearest to the rotational center $O_T$, because the shift of photosensor 6 is zero (0) during detection of the orientation flat 1f. This state is such that the optical axis H of the photosensor 6 is in contact with the edge 1e the wafer at the original point $O_F$, as one example of the singular point as shown in FIG. 3, and it is possible to find the position of the original point $O_F$ by determining the $\theta_o$. Therefore, the calculation for determining the rotational angle $\theta_o$ at which the dn/d$\theta$ =0 in the region F is performed in the calculating means 12 shown in FIG. 1.

Figure 5:
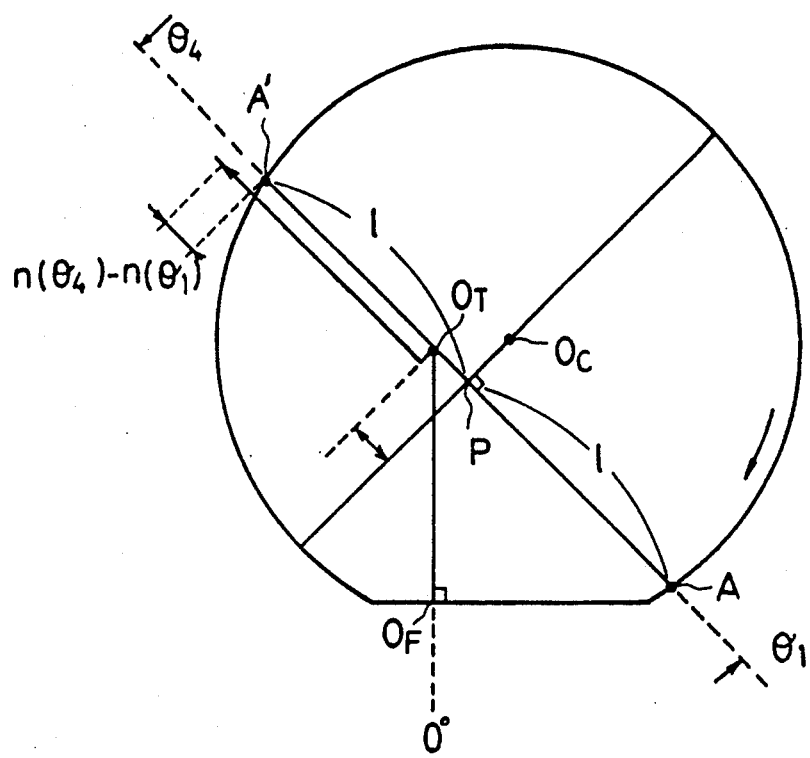
FIG. 5 and 6 are diagrams for explaining a calculation for determining the distance and direction of eccentricity of the rotational center to the center of a circumference of a wafer from data of shift of photosensor.
Figure 6:
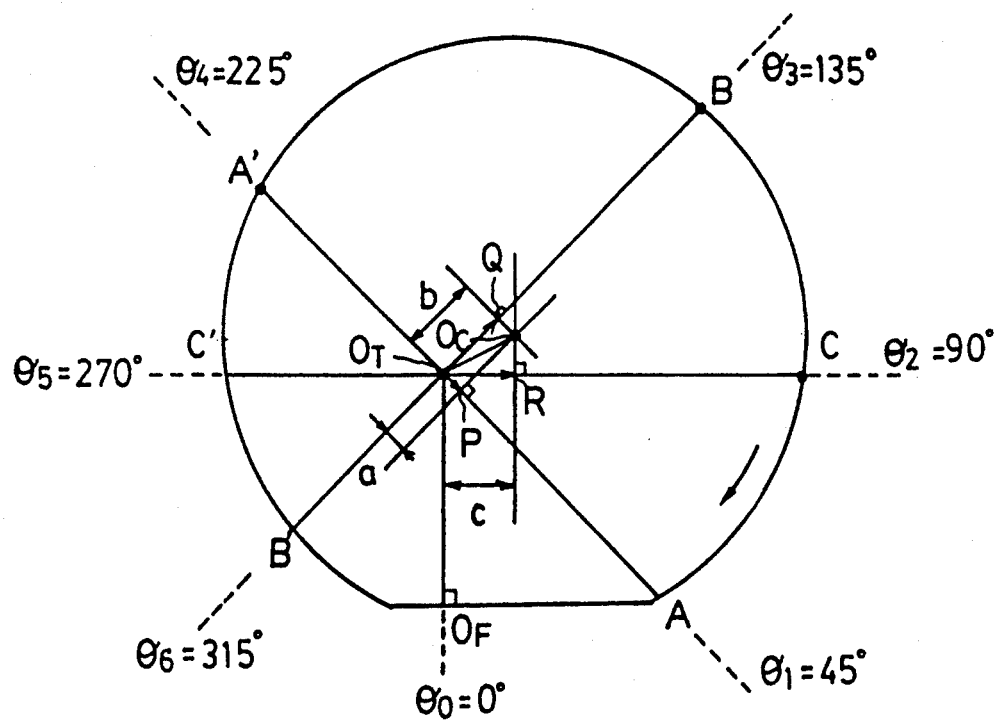

The step III will be described below,

FIGS. 5 and 6 are diagrams for explaining the calculation for determining distance and direction of eccentricity of the rotational center $O_T$ the center $O_c$ of circumference from the, memorized informations for the position of the photosensor 6.

As shown in FIG. 6, points on the edge 1e of the wafer turned through angles $\theta_1$, $\theta_2$, $\theta_3$, $\theta_4$, $\theta_5$ and $\theta_6$ with respect to a line drawn from the rotational center $O_T$ to the original point $O_F$ on the orientation flat are designated by A, C, B, A′, C′ and B′, respectively. More specifically, these angles are as follows:

| | |
|---|---|
| $\theta_1$ | 45° |
| $\theta_2$ | 90° |
| $\theta_3$ | 135° |
| $\theta_4$ | 225° |
| $\theta_5$ | 270° |
| $\theta_6$ | 315° |

If $\theta_4=\theta_1+180°$, $\theta_5=\theta_2+180°$, $\theta_6=\theta_3+180°$, $\theta_2=\theta_o+90°$ and $\theta_3=\theta_1+90°$, the angles $\theta_1$, $\theta_3$, $\theta_4$ and $\theta_6$ are not limited to the above values. However, it is required that the points A and B′ do not lie on the orientation flat.

For example, a line AA′ will now be considered which extends through the rotational center $O_T$ and intersects, at right angles, a line BB′ extending through a center $O_c$ of circumference in FIGS. 5 and 6. If n($\theta_1$) is the position of the photosensor 6 when it detects the point A and n($\theta_4$) is the position of the photosensor 6 when it detects the point A′, the following expression is established:

$$n(\theta_4)-n(\theta_1)=AO_T-A'O_T$$

An intersection P is an intermediate point of the line AA$_1$′ and hence, if Ap=A′P=l, the distance of eccentricity $O_T$P is as follows.

$$O_TP = AO_T - l$$

-continued
$$O_TP = l - A'O_T$$

Thus, the following expression is established $$O_TP=\tfrac{1}{2}\{AO_T-A'O_T\}=\tfrac{1}{2}\{n(\theta_1)-n(\theta_4)\}$$

Accordingly, it is possible to determine the distance of $O_T$P by finding the information for the position of the photosensor 6 at the points A and A′. It is also possible to finding the direction of eccentricity by examination of the sign of $\{n(\theta_4)-n(\theta_1)\}$. Because the values of n($\theta_1$) and n($\theta_4$) are included in the data memorized in the memory means 11 as shown in FIG. 4a, and angle $\theta_4$ may be assigned to conduct a sampling, and the above-described calculation may be carried out by the calculating means 12.

Likewise, the distance and direction of $O_T$Q shown in FIG. 6 can be determined from data of n($\theta_3$) and n($\theta_6$), while the distance and direction of $O_T$R can be determined from data of n($\theta_2$) and n($\theta_5$).

Figure 7:
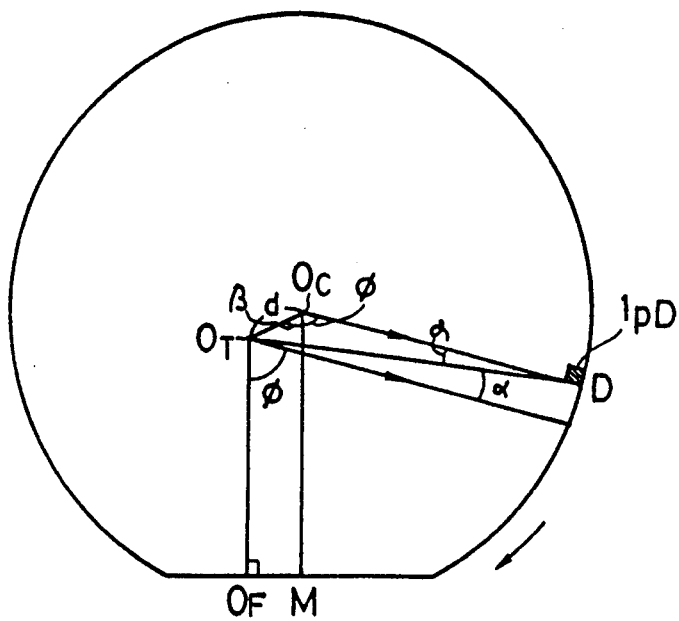
FIG. 7 is a diagram for illustrating a correcting angle $\alpha$.

FIG. 7 is a diagram for illustrating the correcting angle, wherein 1 pD designates a predetermined area of the peripheral part of a wafer; $\phi$ indicates an assignment angle; and $\alpha$ indicates the correcting angle.

The angles which can be read by the rotational angle reading mechanism 5 shown in FIG. 1 are rotational angles of the rotary stage 2 on the basis of the rotational center $O_T$. Thus, for exposure in the step IV which will be described in detail hereinafter, it is required to assign the exposure angle with respect to a line connecting the rotational center $O_T$ with any singular point on the edge.

Thereupon, the assignment angle $\phi$ is first previously assigned with respect to a line connecting the original point $O_F$ on the orientation flat as a singular point with the rotational center $O_T$, as shown in FIG. 7. This assignment angle $\phi$ is assigned in accordance with the position of a predetermined area on the peripheral part of the wafer held by a wafer holder in a subsequent treating step and is previously inputted into the main controller, as shown in FIG. 1. Thus, if the exposure angle $\theta_E$ is represented by a relationship to the assignment angle $\phi$ and the correcting angle $\alpha$, the following expression is established:

$$\theta_E=\phi+\alpha$$

The correcting angle $\alpha$ can be found from the data given in the step II by calculations which will be described herein below.

Figure 8:
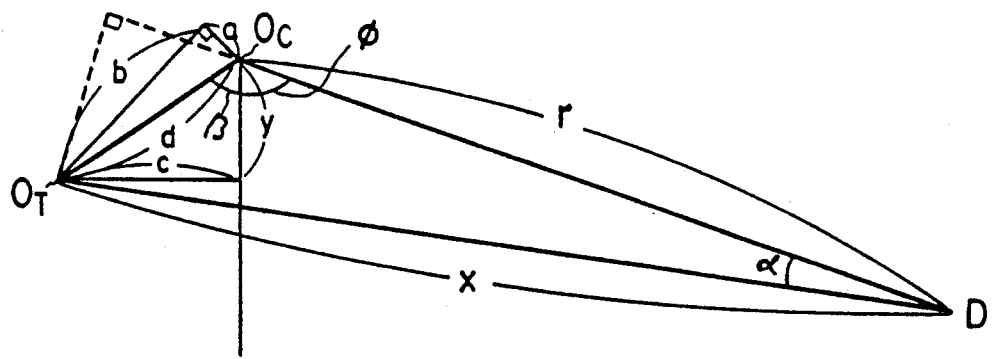
FIG. 8 is a diagram for explaining a calculation for determining the correcting angle $\alpha$.

FIG. 8 is a diagram for explaining the calculations for determining the correcting angle $\alpha$, wherein $O_TP=a, O_TQ=n$, and $O_TR =c$.

In FIG. 8, $$\beta = \tan^{-1}(c/Y) \qquad (1)$$

$$y = \sqrt{a^2 + b^2 - c^2}$$

$$\beta = \tan^{-1}(c/\sqrt{a^2 + b^2 - c^2})$$

In addition, $$x\cos\alpha - d\cos\{180° - (\beta + \phi)\} = r \qquad (2)$$
$$x\cos\alpha + d\cos(\beta + \phi) = r$$
$$d\sin\{180° - (\beta + \phi)\} = x\sin\alpha \qquad (3)$$

-continued $$d \sin(\beta + \phi) = x \sin$$
$$x = d \sin(\beta + \phi)/\sin$$

The substitution of the expression (3) into the expression (2) results in the following expressions.

$$\{d \sin(\beta + \phi)/\sin\alpha\}\cos\alpha + d \cos(\beta + \phi) = r \quad (4)$$
$$\{d \sin(\beta + \phi)/\tan\alpha\} + d \cos(\beta + \phi) = r$$
$$\tan\alpha = \sin(\beta + \phi)/\{(r/d) - \cos(\beta + \phi)\}$$
$$\therefore \alpha = \tan^{-1}\{\sin(\beta + \phi)/(r/d) - \cos(\beta + \phi)\}$$

Therefore, in the calculating means contained in the main controller 3, data for the above-described a, b and c are given from the auxiliary controller 10, and the calculation according to the expression (1) is carried out, followed by the calculation according to the expression (4) to provide a correcting angle $\alpha$. Then, the calculation of $\theta_E = \phi + \alpha$ is conducted from the inputted assignment angle $\phi$ and the calculated correcting angle to give an exposure angle $\theta_E$.

The step IV will be described below.

In FIG. 1, the exposure light source E is comprised of a source lamp E1 such as a short arc type mercury lamp, an elliptic collector mirror E2 for collecting light from the source lamp E1 and directing it into fiber lightguide 14, a planar mirror E3 and a shutter E4. Light from the exposure light source E is guided by the fiber lightguide 14 and emitted from an emitting portion 15 having a projecting lens therein. FIG. 1 shows the emitting portion 15 in its retracted position.

The emitting portion 15 is held by a holder 16 which is mounted on the sensor head 63 for movement in unison with the photosensor 6 and for rectilinear movement on the sensor head 63 toward the rotational axis 1t of the wafer by the holder moving mechanism 17.

In FIG. 1, the rotary stage 2 is started to be rotated again. Then, the rotational angle is read by the rotational angle reading mechanism 5, and a rotational angle-monitored signal is supplied to the main controller 3, When the main controller 3 receives a signal indicative of the fact that the rotational angle has been equal to the exposure angle $\theta_E$, it produces a signal to the holder moving mechanism 17, so that the emitting portion 15 is rectilinearly moved by a given distance at a predetermined speed toward the rotational axis 1t and then returned to its retracted position. This permits an exposure of a predetermined area on the peripheral part of the wafer. The speed and distance of movement of the emitting portion 15 are previously inputted to the main controller 3 in accordance with the rotational speed of the rotary stage 2 and the shape of that predetermined area which is to be exposed. It should be noted that the retracted position of the emitting portion 15 at the initial rotation of the stage does not necessarily lie on a line connecting the original point $O_F$ on the orientation flat as a datum point with the center of rotation. Therefore, it is preferable that the holder moving mechanism 17 is moved when the rotational angle has been equal to the exposure angle $\theta_E$ plus the value of $\theta_o$, because it can be found by the calculation of the singular point in the step II that the singular point $O_F$ has been in what location at the end of one rotation through 360 degree in the step I.

The rotation of the wafer is continued even during movement of the emitting portion 15, but it is also to be understood that the rotation of the wafer may be once stopped by a signal transmitted from the main controller 3 to the stage driving mechanism.

It is preferable for the accuracy of the exposing position that the movement of the emitting portion 15 is from the retracted position toward a central axis of the circle, but this causes a complicated mechanism. If the amount of eccentricity of the rotational center to the center of circumference is not large, then the movement of the emitting portion may be a movement toward the rotational axis 1t as in the present embodiment.

The emitting portion 15 is movable in unison with the photosensor 6 as described above and hence, if the emitting portion 15 is fixed at a predetermined location on the sensor head 63, so that it may be controlled to be moved in unison with the photosensor 6 in a manner to follow the edge of wafer during rotation in the step I, it is possible to concurrently perform an exposure of a band-shaped peripheral area of the wafer spaced at a predetermined distance from the peripheral edge 1e.

Description will be made of another embodiment of the present invention.

Figure 9:
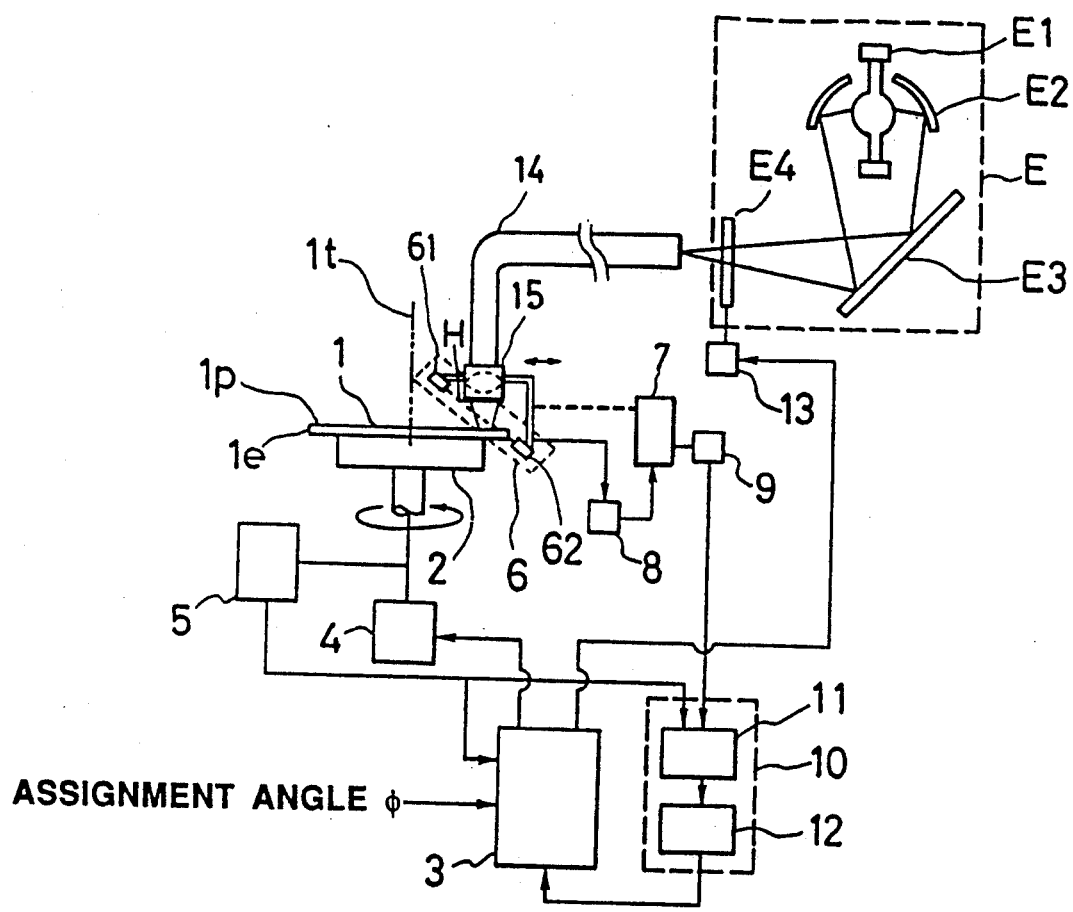
FIG. 9 is a schematic diagram of an apparatus for carrying out a method for exposing a peripheral part of a wafer according to another embodiment of the present invention.
Figure 10A:
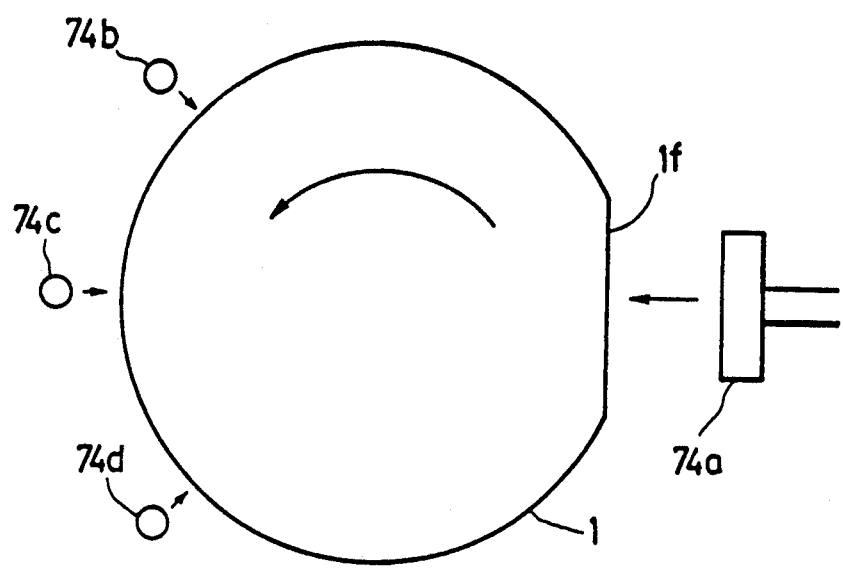
FIG. 10a, 10b and 10c are schematic diagrams for explaining a prior art method for exposing a peripheral part of a wafer.
Figure 10B:
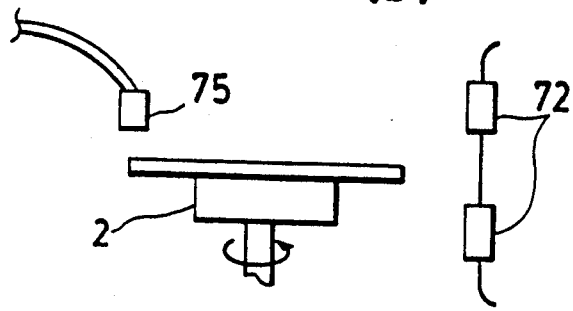
Figure 10C:
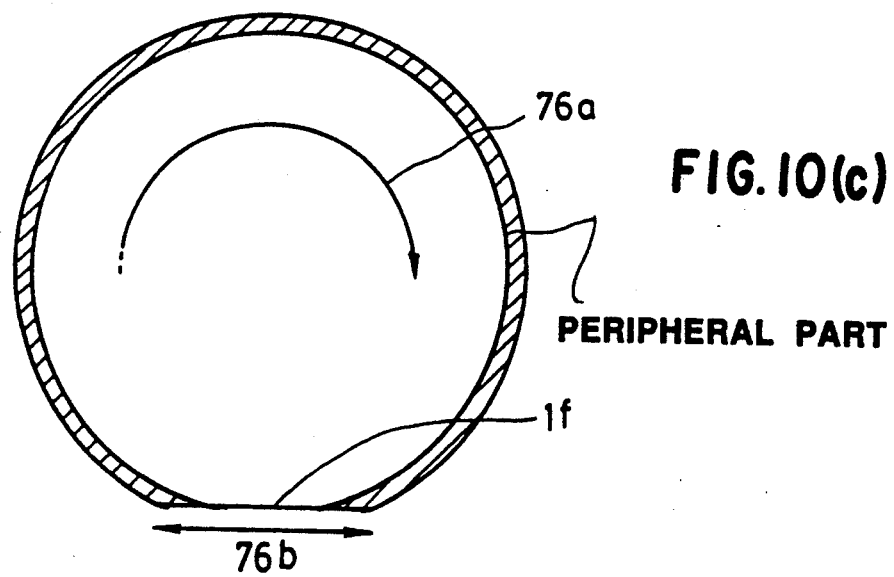

FIG. 9 is a diagram of an apparatus for carrying out a process for exposing a peripheral part of a wafer according to the second embodiment of the present invention. This embodiment uses the same procedure from a first step I to a step III for determining an exposure angle $\theta_E$ as in the previously-described embodiment and therefore, the description to this procedure is omitted.

Referring to FIG. 9, an exposure light source E comprises a source lamp E1 such as a short arc type mercury lamp, an elliptic light-collecting mirror E2 for collecting light from the source lamp E1 and directing such light into a fiber lightguide 14, a planar mirror E3 and a shutter E4. Light from the exposure light source E is guided by fiber lightguide 14 and projected onto a predetermined area of a peripheral part of a wafer by a light emitting portion 15 including a projecting lens therein. The light emitting portion 15 is mounted on a photosensor 6 to permit an exposure of a given area including a point on an edge 1e having an exposure angle $\theta_E$ which will be described hereinafter.

In FIG. 9, the rotary stage 2 is started to be rotated again. Then, the rotational angle is read by the rotational angle reading mechanism 5, and a rotational angle-monitored signal is transmitted to the main controller 3. When the main controller 3 receives a signal indicative of the fact that the rotational angle has been equal to the exposure angle $\Theta_E$, a signal indicative of a command to open the shutter is supplied to the shutter driving mechanism 13, so that the shutter is opened for a predetermined period of time to permit an exposure of a predetermined area of the peripheral part of the wafer. It should be noted that the position of the emitting portion 15 at the initial stage of rotation is necessarily not a position to expose the original point $O_F$ on the orientation flat which is a datum point. Therefore, it is preferable that the shutter E4 is driven when the rotational angle has been equal to the exposure angle $\theta_E$ plus the value of $\theta_o$, because it can be found by the calculation of the singular point in the step II that the singular point $O_F$ has been in what position at the end of one rotation through 360 degree in the step I.

The duration of opening of the shutter is previously determined in accordance with the circumferential length of that predetermined area of the peripheral part of the wafer which is to be exposed, and is inputted into the main controller 3.

If an exposure of a circumferential area having a given width from the peripheral edge 1e is required, the shutter E4 may be opened at the rotation in the step I to provide the exposure in a manner to follow the edge 1e of the wafer 1.

The transmission type photosensor 6 has been used as a peripheral edge detecting sensor in these two embodiments, but it is also possible to use any of various sensors such as a reflection type photosensor, a magnetic sensor and the like.

What is claimed:

1. A method of exposing a photoresist coated on a predetermined area of a peripheral part of a wafer, comprising the steps of:

mounting a wafer on a rotatable stage, rotating said wafer, sensing the peripheral edge of said wafer by a sensor during at least one rotation of said wafer, measuring the angle of rotation during said rotation of said wafer, measuring the movement of said sensor during said rotation of said wafer, recording movements of said sensor corresponding to measured angles of rotation of said wafer during said rotation of said wafer, computing a singular reference point on the periphery of said wafer and a distance and direction of eccentricity of a rotational axis of said wafer relative to a center of said wafer from said recorded movements, computing an exposure angle for the predetermined are of the peripheral part of said wafer based on said computed singular reference point and eccentricity of said rotational axis of said wafer, shifting a light emitting end of an optical fiber lightguide relative to the rotational axis of said wafer while continuing to rotate said wafer, and shifting said light emitting end of said optical fiber lightguide away from the rotational axis of said wafer after detecting an end of rotation of said peripheral part of said wafer through said exposure angle; whereby said predetermined area of said peripheral part of said wafer is exposed by said light emitting optical fiber while said wafer is rotated through said angle of exposure.

2. A method of exposing a photoresist coated on a predetermined area of a peripheral part of a wafer, comprising the steps of:

mounting a wafer on a rotatable stage, rotating said wafer, sensing the peripheral edge of said wafer by a sensor during at least one rotation of said wafer, measuring the angle of rotation during said rotation of said wafer, measuring the movement of said sensor during said rotation of said wafer, recording movements of said sensor corresponding to measured angles of rotation of said wafer during said rotation of said wafer, computing a singular reference point on the periphery of said wafer and a distance and direction of eccentricity of a rotational axis of said wafer relative to a center of said wafer from said recorded movements, computing an exposure angle of the predetermined area of the peripheral part of said wafer based on said computed singular reference point and eccentricity of said rotational axis of said wafer, opening a shutter to expose said predetermined area of a peripheral part of said wafer to a light emitting end of an optical fiber lightguide when said wafer is moved to a position corresponding to a start of said exposure angle while continuing to rotate said wafer, exposing said predetermined area of said peripheral part of said wafer while said shutter is open, and closing said shutter after said wafer has moved through said exposure angle, whereby said predetermined area of said peripheral part of said wafer is exposed by said light emitting optical fiber while said wafer is rotated through said angle of exposure.

* * * * *